United States Patent [19]

Andow et al.

[11] 4,073,008
[45] Feb. 7, 1978

[54] APPARATUS FOR CALCULATING AMPLITUDE VALUES

[75] Inventors: Fumio Andow, Hachioji; Tetsuo Matsushima, Fuchu; Minoru Iwasaki, Kokubunji, all of Japan

[73] Assignees: Tokyo Shibaura Denki Kabushiki Kaisha; Tokyo Denryoku Kabushiki Kaisha, both of Japan

[21] Appl. No.: 717,942

[22] Filed: Aug. 26, 1976

[30] Foreign Application Priority Data

Aug. 29, 1975  Japan .................. 50-104054
Aug. 29, 1975  Japan .................. 50-104055

[51] Int. Cl.$^2$ .................. G06F 15/20; H03K 5/20
[52] U.S. Cl. .................. 364/602; 307/352; 328/135; 328/151; 364/483
[58] Field of Search .................. 235/150.5, 150.53, 197, 235/193, 151.31; 340/347 AD, 248 R, 248 A, 248 B, 248 C, 253 A, 310 A; 328/14, 135, 146, 151; 307/235 B, 235 C, 24, 31, 33, 52, 59, 125, 126, 130, 131; 324/140 R, 141, 142, 103 R, 77 A

[56] References Cited

U.S. PATENT DOCUMENTS

| 3,524,075 | 8/1970 | Matthews et al. .................. 328/146 X |
| 3,569,785 | 3/1971 | Durbeck et al. .................. 235/151.31 X |
| 3,599,103 | 8/1971 | Nussbaumer et al. .................. 328/135 |
| 3,758,763 | 9/1973 | Nohara et al. .................. 324/103 R X |
| 3,848,586 | 11/1974 | Suzuki et al. .................. 328/151 X |

Primary Examiner—Joseph F. Ruggiero
Attorney, Agent, or Firm—Stevens, Davis, Miller & Mosher

[57] ABSTRACT

The amplitude value of a sinusoidal wave is calculated by operating means which processes absolute values of two data samples which are sampled from the sinusoidal wave at two points spaced 90° electrical degrees apart thereby producing an electrical signal proportional to the amplitude value. The operation means comprises a comparator, a combination of an adder and a subtractor, or a combination of a comparator and an adder. The output of the comparator or the combination is multiplied with a predetermined coefficient and then added together to produce said signal.

5 Claims, 9 Drawing Figures

APPARATUS FOR CALCULATING AMPLITUDE VALUES

BACKGROUND OF THE INVENTION

This invention relates to apparatus for calculating the amplitude value of a sinusoidal wave, more particularly sinusoidal current or voltage of an electric power system.

To adequately operate a certain type of a protective relay for an electric power system it is necessary to calculate the amplitude value of the AC voltage or current of the power system. For this purpose, it has been the practice to sample at a predetermined interval the sinusoidal voltage, or current or both of the power system, convert the sample values into digital signals, encode the digital signals and then transmit the encoded digital signals to a receiving end for calculating the amplitude value of the sinusoidal voltage or current. The following two methods have been used to perform such calculation.

A. Addition Method.

According to this method the absolute values of a plurality of data samples in one-half cycle of the input alternating current are added together, and the sum is multiplied with a predetermined coefficient. In an example shown in FIG. 1, an alternating current having a frequency of 50 Hz is sampled at a sampling frequency of 600 Hz, the data samples in one-half cycle are $i_{m-5}$ through $i_m$ and the amplitude value I is calculated by the following equation $$I = \frac{1}{3.798} \sum_{k=m-5}^{m} |i_k| \qquad (1)$$

where $i$ represents an instantaneous value, $m$ a time series.

The error of calculation according to equation (1) caused by the sampling phase is less than $\pm 1.7\%$.

B. Square Method

From a formula of trigonometric function the following equation (2) holds $$\sin^2\theta + \cos^2\theta = \sin^2\theta + \sin^2(\theta + \frac{\pi}{2}) = 1 \qquad (2)$$

This equation shows that the sum of the squares of two data having phase angles different by 90° electrical is equal to the square of the amplitude value of an input alternating current quantity. In the case shown in FIG. 1 wherein an input having a frequency of 50 Hz is sampled at a frequency of 600 Hz, the square of the amplitude value is determined by the following equation.

$$I^2 = i_m^2 + i_{m-3}^2 \qquad (3)$$

With this equation no error is caused by the sampling phase.

The addition method and the square method described above have the following advantages and disadvantages. Thus, according to the square method the amplitude value is determined by two data dephased by 90° electrical, whereas according to the addition method it is necessary to use a plurality of data samples which are sampled from one half cycle of the input alternating current, thus in the example shown in FIG. 1 six data samples. This means that the operation device requires a larger member of memory elements, and that it is necessary to use a higher sampling frequency to attain the desired object.

Although the addition method is advantageous in that a quantity proportional to the amplitude value can readily be obtained by a simple addition operation, the square method requires a mathematical operation to obtain a square root according to equation (3). Where the protection of a power system is performed by an electronic computer in response to digital signals, the operation for determining the square root requires much longer time than the addition operation.

SUMMARY OF THE INVENTION

It is an object of this invention to provide an improved apparatus for calculating the amplitude value of a sinusoidal wave which can eliminate the disadvantage described above.

Generally stated, according to this invention there is provided apparatus for calculating the absolute value of a sinusoidal wave comprising operating means for processing the absolute values of two data samples from the sinusoidal wave at two points spaced 90° electrical apart thereby producing an electrical signal proportional to the amplitude value of the sinusoidal wave. The operating means comprises a comparator for producing a larger one and a smaller one of the absolute values of the two data samples, or a combination of an adder and a subtractor, or a combination of a comparator which produces a larger one or a smaller one of the absolute values of the two sampled data and an adder. In any case, the outputs from the comparator and the adder or subtractor are multiplied with predetermined coefficients and then added together to produce an electrical signal proportional to the amplitude.

BRIEF DESCRIPTION OF THE DRAWINGS

The invention can be more fully understood from the following detailed description taken in conjunction with the accompanying drawings in which.

DESCRIPTION OF THE PREFERRED EMBODIMENTS

Figure 1:
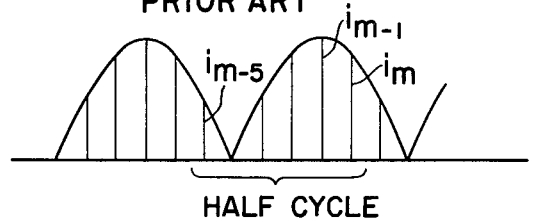
FIG. 1 is a graph showing a prior art method of calculating the amplitude value of a sinusoidal wave.
Figure 2:
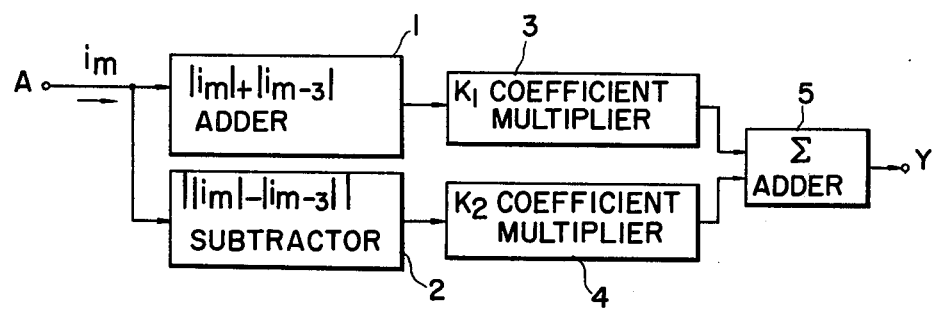
FIG. 2 is a block diagram showing one embodiment of the apparatus for calculating the amplitude value of this invention.

FIG. 2 shows a preferred embodiment of this invention wherein the data obtained by sampling a 50 $H_z$ alternating current wave at a frequency of 600 Hz are applied to an input terminal A. The data are applied in parallel to an adder 1 and a subtractor 2. Adder 1 determines the sum of the absolute values of the two data samples having a phase difference of 90°, whereas subtractor 2 determines the difference of the absolute values of the two data samples, providing this difference as a positive output. The outputs from the adder and subtractor are multiplied with coefficients $K_1$ and $K_2$, respectively, by coefficient multipliers 3 and 4 and the outputs thereof are added together by a second adder 5 thus producing an output Y $$Y = K_1 \{ |i_m| + |i_{m-3}| \} + K_2 ||i_m| - |i_{m-3}|| \quad (4)$$

where $i_m$ and $i_{m-3}$ represent two data samples having a phase difference of 90° electrical. Denoting the amplitude of the AC input by I, then the data $i_m$ and $i_{m-3}$ are expressed by the following equation (5).

$$i_m = I \sin \omega t, \ I_{m-3} = I \sin (\omega t - \frac{\pi}{2}) \quad (5)$$

By substituting equation (5) into equation (4) equation (6) is obtained.

$$Y = K_1 I \{ |\sin \omega t| + |\sin (\omega t - \frac{\pi}{2})| \} + K_2 I \left| |\sin \omega t| - |\sin (\omega t - \frac{\pi}{2})| \right|$$

$$= K_1 I \{ |\sin \omega t| + |\cos \omega t| \} + K_2 I \left| |\sin \omega t| - |\cos \omega t| \right| \quad (6)$$

Considering the periodicity of equation (6) the value Y lies in a range expressed by the following equation (7)

$$Y = K_1 I (\sin \omega t + \cos \omega t) + K_2 I (\cos \omega t - \sin \omega t) \quad (7)$$

where $0 \leq \omega t \leq \pi/4$

When equation (7) is modified by taking $k = K_1/K_2$, the following equation (8) is obtained $$Y = K_2 I \{(k-1) \sin \omega t + (k+1) \cos \omega t\}$$

$$= K_2 I \sqrt{(k-1)^2 + (k+1)^2} \cdot \sin(\omega t + \alpha) \quad (8)$$

where $$\sin \alpha = \frac{k+1}{\sqrt{(k-1)^2 + (k+1)^2}} \quad (9)$$

$$\cos \alpha = \frac{k-1}{\sqrt{(k-1)^2 + (k+1)^2}}$$

Figure 3A:
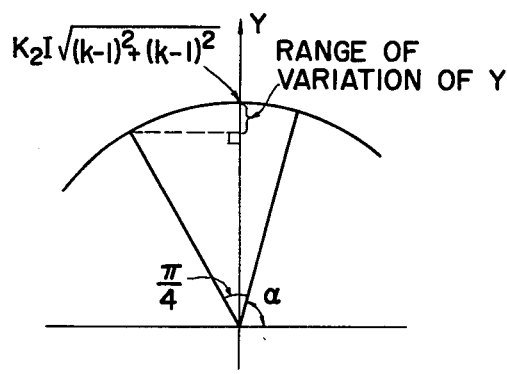
FIGS. 3A and 3B are vector diagrams showing the range of variation in the output Y of the apparatus shown in FIG. 2.
Figure 3B:
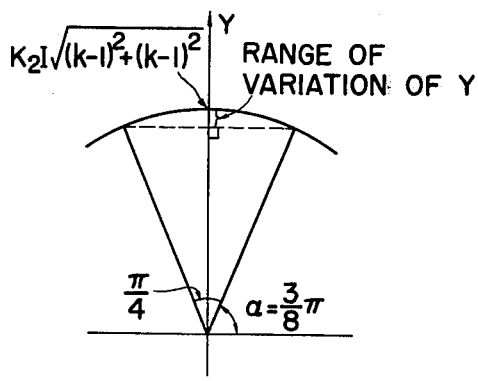

FIG. 3A is a vector diagram showing the range of variation of Y where $0 \leq \omega t \leq \pi/4$ in equation (8). The variation in the value of Y is minimum at $\alpha = \frac{3}{8}\pi$ as shown in FIG. 3B. When $\alpha = \frac{3}{8}\pi$, the value of k is determined to be 2.41 by equation (9), and the range of variation of the value of Y can be shown by the following equation (10)

$$\sin \frac{3}{8}\pi = 0.924 \leq Y/\{K_2 I \sqrt{(-1) + (k+1)^2}\} \leq 1.0 \quad (10)$$

As can be noted from this equation, the range of variation is ±3.95 % about the center of variation. Taking a value of $k_2 = 0.282$, the coefficient of equation (8) becomes $$k_2 I = \sqrt{(k-1)^2 + (k+1)^2} = 1.03951.$$

Thus, from the output Y from adder 5, the amplitude value I can be determined with an error of ±3.96 %. Where a value proportional to the amplitude value I is to be determined, such value can be determined with an error of ±3.95 % by selecting coefficient $K_2$ so as to satisfy a condition $k = 2.41$. By neglecting the error, the operation can be made more readily. For example, when $k_1 = 2$ and $k_2 = 1$ are selected, $k_2 = 2$. As a consequence, from equation (9) $\alpha = 71.5°$ and the error of the value of Y can be calculated from equation (8) to be less than ±5.5% about the center.

As above described, according to this invention, it is possible to readily calculate the amplitude value of a sinusoidal wave by using two data samples dephased 90° electrical without performing an operation for determining a square root although the error is slightly increased whereby the defects of the addition method and the square method are eliminated.

Although in FIG. 2 two coefficient multipliers 3 and 4 are provided either one of them may be omitted by suitably selecting the coefficient.

Figure 4:
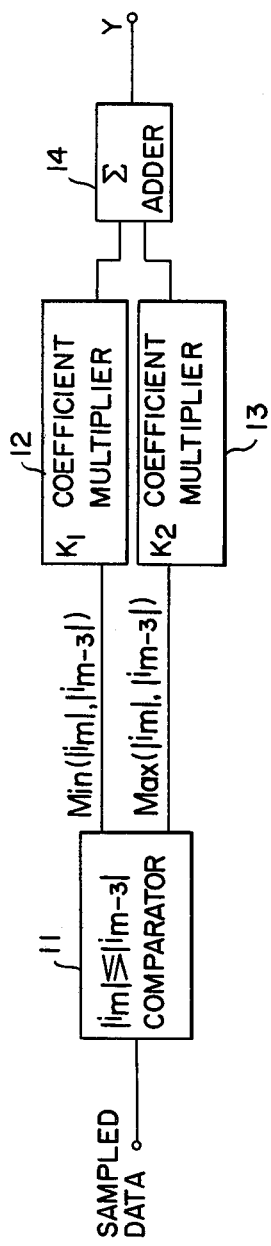
FIG. 4 is a block diagram showing another embodiment of this invention.

In a modified embodiment shown in FIG. 4 a comparator 11 is provided to compare the absolute values of two data samples $i_m$ and $i_{m-3}$ having a phase difference of 90°. A smaller one Min $\{|i_m|, |i_{m-3}|\}$ and a larger one Max $\{|i_m|, |i_{m-3}|\}$ respectively selected by the comparator 11 are multiplied with coefficients $k_1$ and $k_2$ respectively by coefficient multipliers 12 and 13 and the outputs of the coefficient multipliers are added together by an adder 14 to provide an output Y $$Y = K_1 \text{Min} \{|i_m|, |i_{m-3}|\} + K_2 \text{Max} \{|i_m|, |i_{m-3}|\} \quad (11)$$

By substituting equation (5) into equation (11), equation (11) is modified as follows.

$$Y = K_1 I \text{Min} \{ |\sin \omega t|, |\sin(\omega t - \frac{\pi}{2})| \}$$
$$+ K_2 I \text{Max} \{ |\sin \omega t|, |\sin(\omega t - \frac{\pi}{2})| \}$$
$$= K_1 I \text{Min} \{ |\sin \omega t|, |\cos \omega t| \}$$
$$+ K_2 I \text{Max} \{ |\sin \omega t|, |\cos \omega t| \} \quad (12)$$

Considering the periodicity of equation (12), the range of Y is expressed by $$Y = K_1 I \sin \omega t + K_2 I \cos \omega t \quad (13)$$

where $0 \leq \omega t \leq \pi/4$

Figure 5A:
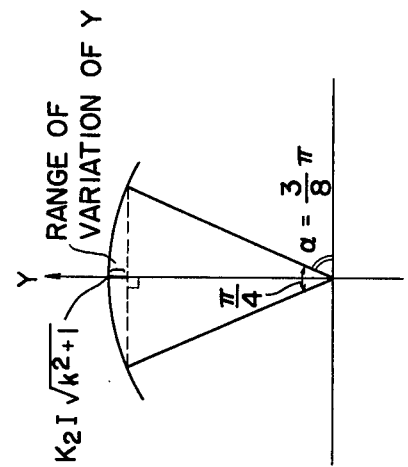
FIGS. 5A and 5B are vector diagrams showing the range of variation in the output Y of the apparatus shown in FIG. 4.
Figure 5B:
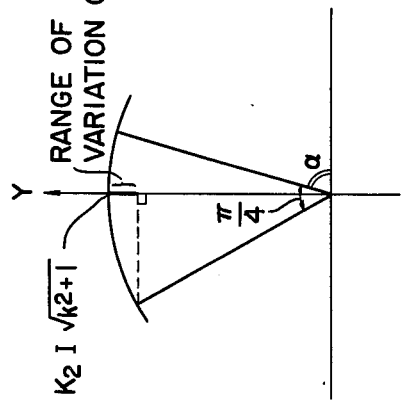

Equation (13) can be modified as follows by putting $$k = k_1/k_2$$

$$Y = K_2 I (k \sin \omega t + \cos \omega t)$$

$$= K_2 I \sqrt{k^2 + 1} \sin(\omega t + \alpha) \quad (14)$$

where $$\sin \alpha = \frac{1}{\sqrt{k^2 + 1}}$$
$$\cos \alpha = \frac{k}{\sqrt{k^2 + 1}} \quad (15)$$

Where $0 \leq \omega t \leq \pi/4$, the range of Y expressed by equation (14) is shown by FIG. 5A and the variation of Y is minimum when $\alpha = \frac{3}{8}\pi$ as shown in FIG. 5B. Under these conditions, the value of k determined by equation 15 is equal to 0.414. Further from equation (14)

$$\sin \frac{3}{8} \pi = 0.924 \leq \frac{Y}{K_2 I \sqrt{k^2 + 1}} \leq 1.0 \quad (16)$$

This means that the output signal Y varies within a range of ±3.96 %. Assume now that $k_2 = 0.9605$, the coefficient of equation (14) becomes equal to 1.03961 so that it It possible to determine the amplitude value within an error range of ±3.96 %. 1 a Where a value proportional to the amplitude value is to be determined, such value can be determined with an error of ±3.96 % by selecting coefficient $K_2$ so as to satisfy a condition $k = 0.414$. it will be noted that this error is equal to the error of the first embodiment. By neglecting the error, the operation can be made more readily. For example, when $k_1 = 1$ and $k_2 = 2$ are selected $k = 0.5$. Consequently, from equation (15) $\Delta = 63.4°$ and the range of variation of Y can be limited to be less than ±5.6%.

Figure 6:
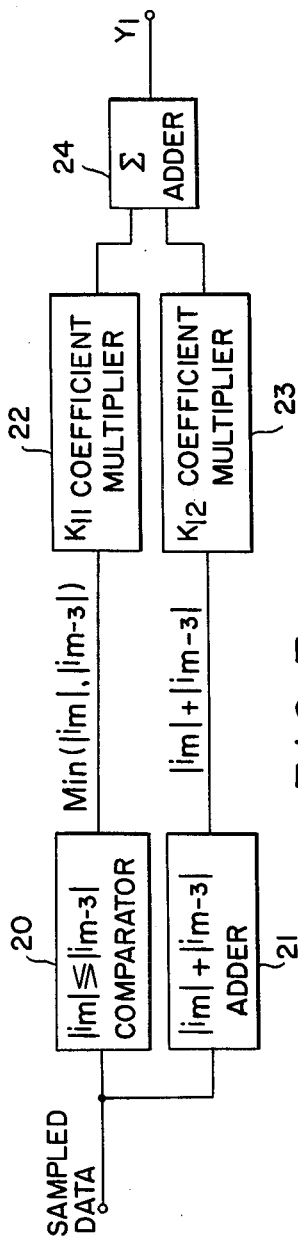
FIGS. 6 and 7 are block diagrams showing still other embodiments of this invention.

FIG. 6 shows still another embodiment of this invention which comprises a comparator 20 which compares the absolute values of two data samples $i_m$ and $i_{m-3}$ also having a phase difference of 90° for producing a smaller one Min $\{|i_m|, |i_{m-3}|\}$, and an adder 21 which produces the sum of the absolute values of the data $i_m$ and $i_{m-3}$. The outputs from comparator 20 and adder 21 are multiplied with coefficients $K_{11}$ and $K_{12}$, respectively, by coefficient multipliers 22 and 23, and the outputs thereof are added each other by an adder 24 to produce an output Y, expressed by the following equation $$Y_1 = K_{11} \text{Min}\{|i_m|, |i_{m-3}|\} + K_{12}\{|i_m| + |i_{m-3}|\}$$

$$= (K_{11} + K_{12}) \cdot \text{Min}\{|i_m|, |i_{m-3}|\}$$

$$+ K_{12} \text{Max}\{|i_m|, |i_{m-3}|\} \qquad (17)$$

In equation (17) by putting $K_1 = K_{11} + K_{12}$ and $K_2 = K_{12}$ an equation identical to equation (11) can be obtained with the result that a value proportional to the amplitude value can be obtained with an error of less than ±3.96% in the same manner as above described. Putting now $k = K_1/K_2 = 0.414$, then $K_{11} = -0.586 K_{12}$.

Figure 7:
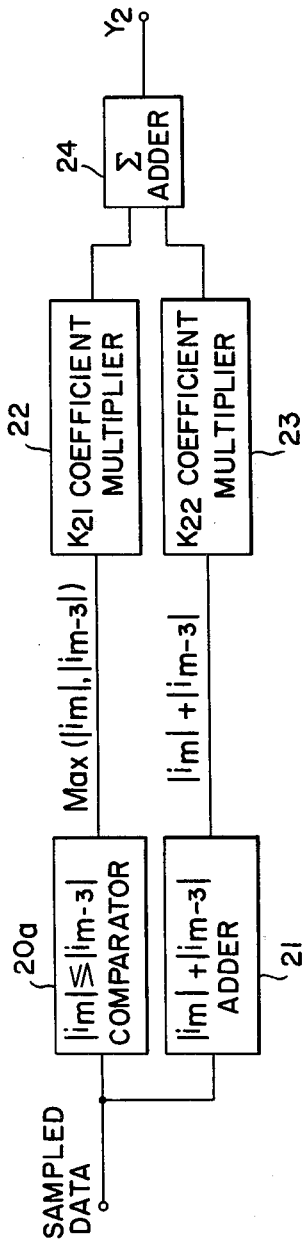

FIG. 7 shows still further modification of this invention which comprises a comparator 20a and an adder 21. In this case, the comparator 20a compares the absolute values of two data samples $i_m$ and $i_{m-3}$ and produces a larger one Max $\{|i_m|, |i_{m-3}|\}$ as its output. The outputs from the comparator and the adder are multiplied with coefficients $K_{21}$ and $K_{22}$ respectively by coefficient multipliers 22 and 23 and the outputs thereof are added together by a second adder 24 thus producing an output $Y_2$ $$Y_2 = K_{21} \text{Max}\{|i_m|, |i_{m-3}|\} + K_{22}\{|i_m| + |i_{m-3}|\}$$

$$= K_{22} \text{Min}\{|i_m|, |i_{m-3}|\}$$

$$+ (K_{21} + K_{22}) \text{Max}\{|i_m|, |i_{m-3}|\} \qquad (18)$$

If we put $K_1 = K_{22}$, $K_2 = K_{21} + K_{22}$, equation (18) becomes to have the same form as equation (11) so that $Y_2$ represents a value proportional to the amplitude value with an error of less than ±3.96%. If $k = K_1/K_2 = 0.414$, $K_{21} = 1.42 K_{22}$.

This embodiment too can calculate the amplitude value of a sinusoidal wave without calculating a square root as in the prior art method.

We claim:

1. An apparatus for calculating the amplitude value of a sinusoidal wave comprising a terminal for receiving signals representing absolute values of two data samples which are sampled from said sinusoidal wave at two points spaced 90° electrical apart by a sampling frequency which is an integer multiple of the frequency of said sinusoidal wave, and operating means coupled to said terminal for receiving said signals representing absolute values of said two data samples and for producing therefrom an electrical signal which is proportional to the amplitude of said sinusoidal wave.

2. The apparatus according to claim 1 wherein said operating means comprises a first adder for producing the sum of the absolute values of two data samples which are sampled from said sinusoidal wave at two points spaced 90° electrical, a subtractor for producing the absolute value of the difference between said two absolute values, a coefficient multiplier connected to said first adder and said subtractor for multiplying said first adder and said subtractor outputs by respective predetermined constants and for providing said multiplied outputs as first and second signals, at least one of said constants being of a value other than unity, and a second adder for adding together said first and second signals.

3. The apparatus according to claim 1 wherein said operating means comprises a comparator for comparing the absolute values of two data samples which are sampled from said sinusoidal wave at two points spaced 90° electrical thereby producing a larger one and a smaller one of said two absolute values as output signals, a coefficient multiplier connected to said comparator for multiplying said output signals by respective predetermined constants and for providing said multiplied output signals as first and second signals, at least one of said constants being of a value other than unity, and an adder for adding together said first and second signals.

4. The apparatus according to claim 1 wherein said operating means comprises a comparator for producing a smaller one of said absolute values of said two data samples as the output thereof, a first adder for adding together said two absolute values, a coefficient multiplier connected to the outputs of said comparator and said first adder for multiplying the outputs of said comparator and said first adder by respective predetermined constants and for providing said multiplied outputs as first and second signals, at least one of said constants being of a value other than unity, and a second adder for adding together said first and second signals.

5. The apparatus according to claim 1 wherein said operating means comprises a comparator for producing a larger one of said absolute values of said two data samples as the output thereof, a first adder for adding together said absolute values, a coefficient multiplier connected to said comparator and first adder for multiplying the outputs of said comparator and said first adder by respective predetermined constants and for providing said multiplied outputs as first and second signals, at least one of said constants being of a value other than unity, and a second adder for adding together said first and second signals.

* * * * *